United States Patent [19]

Takatori et al.

[11] Patent Number: 5,373,464
[45] Date of Patent: Dec. 13, 1994

[54] CCD ARRAY MEMORY DEVICE HAVING DUAL, INDEPENDENT CLOCKS OF DIFFERING SPEEDS

[75] Inventors: Sunao Takatori; Makoto Yamamoto, both of Tokyo, Japan

[73] Assignee: Yozan Inc., Tokyo, Japan

[21] Appl. No.: 77,084

[22] Filed: Jun. 16, 1993

[30] Foreign Application Priority Data

Jun. 23, 1992 [JP]  Japan .................................. 4-189864

[51] Int. Cl.$^5$ ............................................. G11C 11/34
[52] U.S. Cl. ..................................... 365/183; 365/77; 365/78; 365/219; 365/240
[58] Field of Search ............... 365/183, 239, 240, 241, 365/77, 78, 219

[56] References Cited

U.S. PATENT DOCUMENTS

| | | | |
|---|---|---|---|
| 4,165,539 | 8/1979 | Aichelmann, Jr. .................. | 365/183 |
| 4,322,635 | 3/1982 | Redwine ............................. | 365/240 |
| 4,388,701 | 6/1983 | Aichelmann, Jr. et al. .......... | 365/77 |
| 4,725,748 | 2/1988 | Hayes et al. ........................ | 365/183 |

OTHER PUBLICATIONS

Electrical Engineering Handbook, Editor-in-Chief, Richard C. Dorf, pp. 1726–1727 and 1735, CRC Press 1993.

Primary Examiner—Eugene R. LaRoche
Assistant Examiner—Christopher R. Glembocki
Attorney, Agent, or Firm—Cushman, Darby & Cushman

[57] ABSTRACT

The present invention provides a memory device for preventing data circulating on a plural number of linear CCD array from being corrupted, for accessing data at a high speed, and for reducing the device's electric power consumption.

A memory device according to this invention downsizes a block of a memory cell by circulating data on a plural number of linear CCD arrays which are for storing data by an electric charge on a cell and keeping analog data, which sets a clock generation means for circulating data on all arrays and another clock generation means for circulating at a high speed only the array loops having necessary data.

14 Claims, 3 Drawing Sheets

CCD ARRAY MEMORY DEVICE HAVING DUAL, INDEPENDENT CLOCKS OF DIFFERING SPEEDS

FIELD OF THE INVENTION

The present invention relates to a memory device, especially to a memory device which is effective for storing analog data or multilevel digital data.

BACKGROUND OF THE INVENTION

The digital computer is so commonly used as a programmable computer because the size and the capacity of digital memory components have rapidly become small and large, respectively, in comparison to analog memories. But recently, it is close to the limit to produce higher density of digital LSI. Conventionally, the scale of a memory circuit is large and the process of production is complicated in order to realize a memory in an analog or in a multilevel architecture.

A method for downsizing a block of memory cell storing analog data by means of the circulation of data on a plural number of linear CCD arrays in order to solve the aforementioned problem has been developed; however, this method is problematic because data is worse when the CCD circulation speed is slower, and electric power consumption necessarily increases when the circulation speed is increased to prevent the data from getting worse and to facilitate accessing the circulating data at a high speed.

SUMMARY OF THE INVENTION

The present invention solves the above-mentioned problems of the prior art and has an object of providing a memory device for preventing data circulating on a plural number of linear CCD array elements from getting worse, for accessing data at a high speed, and for reducing the electric power consumption of the device.

A memory device according to the present invention makes it possible to prevent data from getting worse, permits accessing data at a high speed and reduces the electric power consumption of the device by providing i) a clock generation means for circulating data on all arrays by downsizing a block of memory cells by means of circulating data on a plural number of linear CCD element arrays and keeping analog data, and ii) another clock generation means for circulating at a high speed only the array loops having necessary data.

PREFERRED EMBODIMENT OF THE PRESENT INVENTION

Hereinafter, an embodiment of a memory device according to the present invention is described with reference to the attached drawings.

Figure 1:
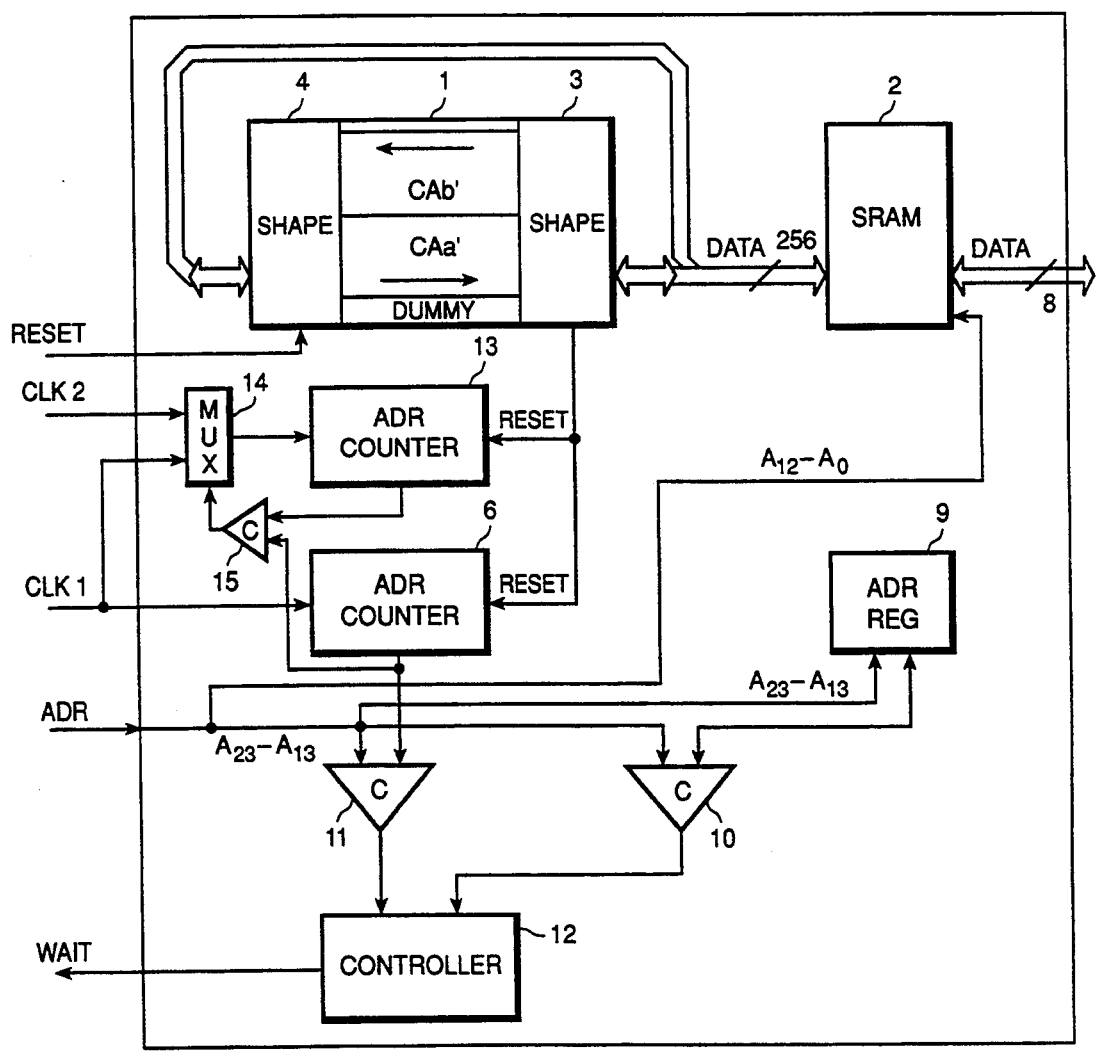
FIG. 1 shows a block diagram of an embodiment of an memory device according to the present invention.

FIG. 1 shows the entire circuit of the memory device. It comprises main memory 1 and cache memory 2, both of which are composed of CCD arrays.

In main memory 1, a plural number of looped CCD arrays "L" are connected in parallel. The CCD array is connected CCD array CAa by looping. The set of CCD array CAa and CAb are expressed by CAa' and CAb', respectively, in FIG. 1. CCD array CAa transmits data to the end direction keeping the data, and CCD array CAb returns data to the start point keeping the data. It means that the CCD array keeps data in the entire circular route and has twice as large a storage capacity than a similar device for storing data in one way. It is also possible to simplify the circuit by forming the return root by a simple conductor.

Figure 2:
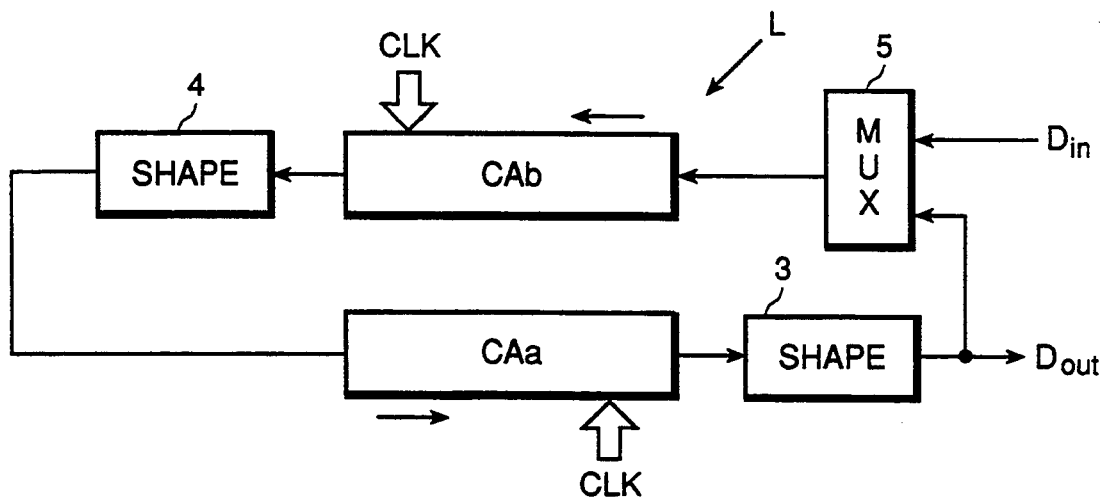
FIG. 2 shows a block diagram of a loop array of a CCD device of the embodiment in FIG. 1.

In FIG. 2, shaping circuits 3 and 4 are connected to the end points of CCD arrays CAa and CAb, respectively. Corrupted data (whose level became poor) is restored by the A/D converting function of the shaping circuits. The output of shaping circuit 3 is connected to CCD array CAb through two inputs of multiplexer 5 and is able to write new data from Din. Branch Dout is set on the output of shaping circuit 3. Data can be read from the branch Dout. It is shown in FIG. 1 by "DATA". Generally, a CCD has a more structure than a cell of a conventional DRAM. The necessary area for the storage of one datum is small and analog data can be stored in a cell. Therefore it is possible to realize a memory with a larger capacity with a CCD device than with a general purpose DRAM.

Figure 3:
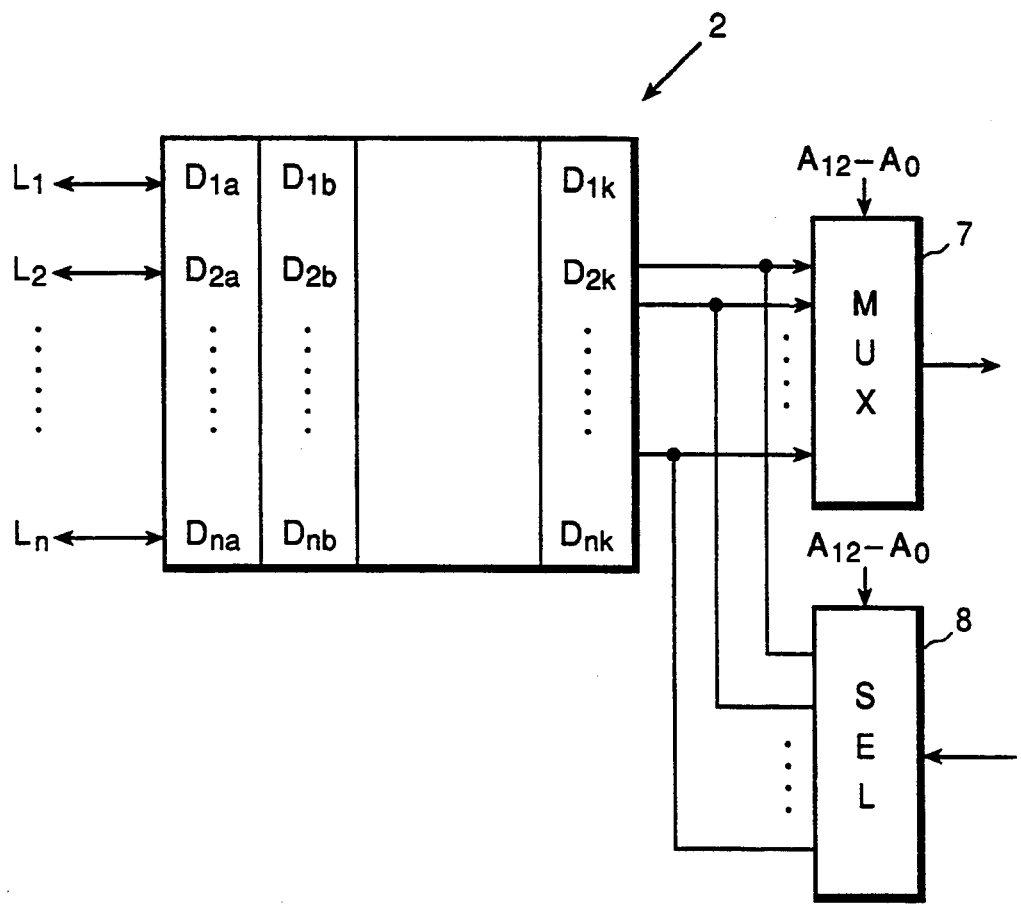
FIG. 3 shows a block diagram of a cache memory of the embodiment shown in FIG. 1.

Cache memory 2 is a high speed RAM for once storing data to read and write from/to main memory 1 (an SRAM is usually used). As shown in FIG. 3, cache memory 2 comprises a row address from L1 to Ln of the numbers corresponding to each CCD array loop "L". This means that a unit of data of all array loops can be simultaneously transmitted from main memory 1 to cache memory 2, and vice versa. A high speed of transmission is guaranteed by this configuration.

The data of the CCD array is transmitted by a transmission clock and circulates on the loop array.

The transmission clock for the circulation is set at a level higher than the predetermined value so as to prevent data from getting worse. Clock signal CLK1 of a relatively low speed is used for usual circulation. When accessing data, a high speed clock signal CLK2 is used in order to read and write data at a high speed.

Clock signals CLK1 and CLK2 are generated by independent clock generation means, and input to the memory device. The clock signals CLK1 and CLK2 are to be selectively input to CCD array CAa and CAb, and selectively input to address counter 13 through a multiplexer 14. Clock signals CLK1 is input to address counter 6, and controls the address of the data of each CCD array when data is transmitted for conventional refresh operations. As multiplexer 14 inputs clock signal CLK1 to address counter 13, address counter 6 and 13 synchronously count the same number.

When a CCD array is required to read or write data, clock signal CLK2 is input to the CCD array which is transmitted at a high speed. Multiplexer 14 inputs clock signal CLK2 to address counter 14, and controls address counter 13 to only address on the CCD array transmitted in high speed. As other CCD arrays are transmitted at a low speed by clock signal CLK1, the consumptive electric power is only a fraction of that of whole of the memory device. When writing or reading data is completed, the counted value by address counters 6 and 13 are compared in comparator 13 and clock signal CLK2 is input to address counter 13 until the two values are the same. When the two values counted by the both counters are the same, multiplexer 14 inputs CLK1 signal instead of signal CLK2 to address counter 13 consequently, address counters 6 and 13 return to the synchronous count.

The address of a CCD array is always controlled an address counter. In order to verify it, a dummy CCD array loop is set in the main memory (shown by "DUMMY" in FIG. 1) and the address of the main memory is registered in the array.

Figure 4:
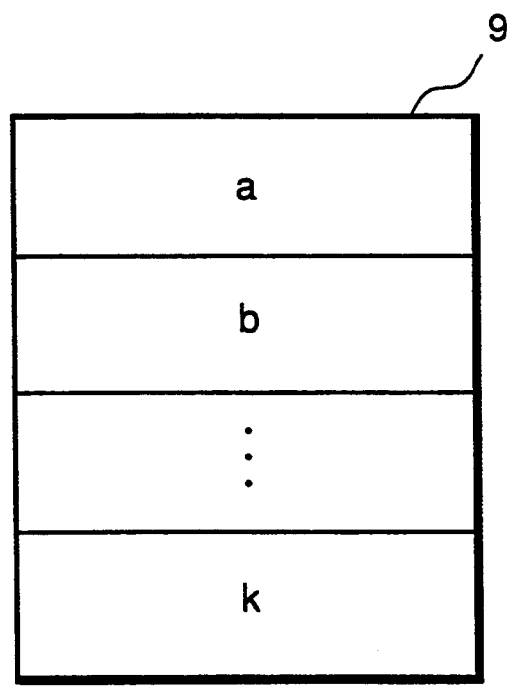
FIG. 4 shows an address register of the embodiment of FIG. 1.

The addresses of multiplexer 7 and selector 8 are designated by inputting upper bits from $A_{23}$ to $A_{13}$ of ADR from outside of the device. As these upper bits of the address are simultaneously input to address register 9, the address of the data stored in the cache memory can be identified by checking the content in the address register. The check is executed by comparator 10 which is set by the same number of the addresses to be stored ("k", in FIGS. 3 and 4). The lower bits of ADR from $A_{12}$ to $A_0$ are designated column addresses corresponding to the data of each row address. Reading and writing to a cache memory from outside is performed with respect to the designated column address.

When data is read and data does not exist in cache memory 2, it is necessary to write the required data in the cache memory after the data of transmitted to the end of CAa in main memory 1. Consequently, the address counter is input in comparator 11 and it is compared with $A_{23}$ to $A_{13}$.

When data is written and data does not exist in memory 2, only the column address of new data is overwritten on the oldest data in the cache memory, the required data in row address is transmitted to the cache memory from the main memory with the written address masked, and the composed data is back to the main memory.

The output of comparator 10 and 11 is input to controller 12. A wait signal WAIT is output from controller 12 in order to keep the waiting time for accessing a cache memory and for bringing data in the case where there is no data is in a cache memory.

As mentioned, the memory device according to the present invention realizes the small scale cell by means of storing analog data by circulating data on a plural number of linear CCD arrays makes it possible to access the memory of high speed by reading and writing data through a cache memory, and by registering on an address register the address of the data in the cache memory. Therefore, it is possible to realize an analog memory or a multivalue memory with a small circuit. Also it is possible to reduce the electric power consumption of the device by circulating at a high speed only the required data when at a lower necessary, and circulating other unnecessary data in speed for preventing the denigration of data.

What is claimed is:
1. A memory device comprising:
 i) a plurality of CCD arrays having cells for storing data as electrical charges thereon;
 ii) first transmission clock generating means for constantly generating a first transmission clock for causing charges stored in cells in said CCD arrays to be successively shifted between said cells;
 iii) second transmission clock generating means for generating a second transmission clock for causing charges stored in cells in said CCD arrays to be successively shifted between said cells at a higher speed than with said first transmission clock;
 iv) a shaping circuit for shaping data on an end of at least one of said plurality of CCD arrays;
 v) a feedback line for feeding shaped data back to a beginning end of a first one of said plurality of CCD arrays;
 vi) a cache memory comprising row addresses corresponding to said plurality of CCD arrays;
 vii) a first address counter designating a location of data on one of said CCD arrays as a column address by counting said first transmission clock;
 viii) second address counter designating a location of data on one of said CCD arrays as a column address by counting said second transmission clock;
 ix) an address register for registering a column address of data registered in said cache memory;
 x) address input means for inputting a new address; and
 xi) a first comparator comparing said column address in said address register with an address newly input.

2. A memory device as claimed in claim 1, further comprising a comparator for comparing counted values of said first address counter and said second address counter.

3. A memory device comprising:
 CCD array means for circulating, responsive to a transmission clock signal, electric charges representative of digital data;
 input/output means, connected to said CCD array means, for writing data to said CCD array means and for reading data from said CCD array means; and
 transmission clock means for generating said transmission clock signal at a first frequency to maintain said CCD array means in a quiescent state and at a second frequency to permit said input/output means to read and write said data.

4. The memory device of claim 3 wherein said second frequency is greater than said first frequency.

5. The memory device of claim 4 wherein said first frequency is of a magnitude sufficient to preserve integrity of said electric charges.

6. The memory device of claim 3 wherein said transmission clock means comprises:
 first clock means for generating a first clock signal at said first frequency;
 second clock means for generating a first clock signal at said second frequency; and
 selection means connected to said first and second clock means for selectively outputting one of said first and second clock signals as said transmission clock signal.

7. The memory device of claim 6 wherein said selection means comprises:
 first counter means, responsive to said first clock means, for counting a first address in said CCD array means;
 second counter means, responsive to said transmission clock signal, for counting a second address in said CCD array means;
 comparator means, responsive to said first and second counter means, for providing a signal indicative of whether said first and second addresses are equal; and
 multiplexer means, responsive to said comparator signal, for outputting one of said first and second clock signals as said transmission clock signal when said first and second addresses are equal and for outputting another of said first and second clock signals as said transmission clock signal when said first and second addresses are not equal.

8. The memory device of claim 7, wherein said multiplexer means outputs said first clock signal when said first and second addresses are equal and outputs said second clock signal when said first and second addresses are not equal.

9. A memory device comprising:
a plurality of CCD array means each for circulating, responsive to a respective transmission clock signal, electric charges representative of digital data;
input/output means, connected to said plurality of CCD array means, for writing data to said plurality of CCD array means and for reading data from said plurality of CCD array means; and
transmission clock means for simultaneously generating a first transmission clock signal to a first CCD array means at a first frequency to permit said input/output means to read and write said data to said first CCD array means and a second transmission clock signal to a second CCD array means at a second frequency to maintain said second CCD array means in a quiescent state.

10. The memory device of claim 9 wherein said first frequency is greater than said second frequency.

11. The memory device of claim 10 wherein said second frequency is of a magnitude sufficient to preserve integrity of said electric charges.

12. The memory device of claim 9 wherein said transmission clock means comprises:

first clock means for generating a first clock signal at said first frequency;
second clock means for generating a second clock signal at said second frequency; and
selection means connected to said first and second clock means for selectively outputting one of said first and second clock signals as each of said first and second transmission clock signals.

13. The memory device of claim 12 wherein said selection means comprises:
first counter means, responsive to said second transmission clock signal, for counting a first address in said first CCD array means;
second counter means, responsive to said second clock means, for counting a second address in said second CCD array means;
comparator means, responsive to said first and second counter means, for providing a signal indicative of whether said first and second addresses are equal; and
multiplexer means, responsive to said comparator signal, for outputting one of said first and second clock signals as said first transmission clock signal when said first and second addresses are equal and for outputting another of said first and second clock signals as said first transmission clock signal when said first and second addresses are not equal.

14. The memory circuit of claim 13, wherein said multiplexer means outputs said second clock signal when said first and second addresses are equal and outputs said first clock signal when said first and second addresses are not equal.

* * * * *